United States Patent
Min et al.

(10) Patent No.: US 10,446,703 B1
(45) Date of Patent: Oct. 15, 2019

(54) METHOD FOR MANUFACTURING CIGS THIN FILM FOR SOLAR CELL

(71) Applicant: KOREA INSTITUTE OF SCIENCE AND TECHNOLOGY, Seoul (KR)

(72) Inventors: Byoung Koun Min, Seoul (KR); Gi Soon Park, Seoul (KR); Hyung Suk Oh, Seoul (KR); Yun Jeong Hwang, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 16/023,859

(22) Filed: Jun. 29, 2018

(30) Foreign Application Priority Data

Apr. 17, 2018  (KR) .................. 10-2018-0044533

(51) Int. Cl.
*H01L 31/032* (2006.01)
*C23C 16/30* (2006.01)
*C23C 16/02* (2006.01)
*H01L 31/0392* (2006.01)
*H01L 31/0272* (2006.01)

(52) U.S. Cl.
CPC ...... *H01L 31/0322* (2013.01); *C23C 16/0218* (2013.01); *C23C 16/305* (2013.01); *H01L 31/0272* (2013.01); *H01L 31/03923* (2013.01)

(58) Field of Classification Search
CPC .......... H01L 31/0272; H01L 31/03923; H01L 31/0322
See application file for complete search history.

(56) References Cited

U.S. PATENT DOCUMENTS

| | | | |
|---|---|---|---|
| 8,759,142 B2 | 6/2014 | Cho et al. | |
| 2014/0216552 A1* | 8/2014 | Cho .................... | H01L 31/0749 136/262 |
| 2014/0273335 A1* | 9/2014 | Abushama .......... | H01L 31/0749 438/95 |
| 2014/0366946 A1* | 12/2014 | Sang ................... | H01L 31/0322 136/262 |
| 2015/0303328 A1* | 10/2015 | Yun .................... | H01L 31/0749 136/262 |

FOREIGN PATENT DOCUMENTS

KR  1020150115312 A  10/2015
KR  1020170036606 A  4/2017

* cited by examiner

*Primary Examiner* — Joseph C. Nicely
(74) *Attorney, Agent, or Firm* — Cantor Colburn LLP

(57) ABSTRACT

Methods of manufacturing a CIGS thin film for a solar cell are provided. According to the method, a CIGS thin film having an ideal double band gap grade structure with a large particle size may be obtained by heat-treating a solution-treated CIG oxide thin film by a three-step chalcogenization process. Accordingly, performance of the solar cell may be improved.

18 Claims, 8 Drawing Sheets

THREE-STEP HEAT-TREATING OF CHALCOGENIZATION PROCESS

CdS/CIGS P-N JUNCTION
STRUCTURE (Cd,Zn)S/CIGS P-N
JUNCTION STRUCTURE

METHOD FOR MANUFACTURING CIGS THIN FILM FOR SOLAR CELL

CROSS-REFERENCE TO RELATED APPLICATION

This application claims the benefit of Korean Patent Application No. 10-2018-0044533, filed on Apr. 17, 2018, in the Korean Intellectual Property Office, the disclosure of which is incorporated herein in its entirety by reference.

BACKGROUND

1. Field

One or more embodiments relate to a method of manufacturing a CIGS thin film for a solar cell, and more particularly, to a method of manufacturing a CIGS thin film for a solar cell capable of improving solar cell performance, a method of manufacturing a junction structure of a buffer layer and a CIGS thin film for a solar cell, a method of manufacturing a solar cell using the method of manufacturing a CIGS thin film, and a solar cell including a CIGS thin film manufactured according to the method of manufacturing a CIGS thin film.

2. Description of the Related Art

Photovoltaic cells, i.e., solar cells, refer to devices capable of converting solar energy into electrical energy. Particularly, when light is incident on a photosensitive material included in the photovoltaic cell, electrons and holes created via photovoltaic effects generate current-voltage. Since such a photovoltaic cell may obtain electrical energy from pollution-free solar energy, which is the source of all energy, extensive research and development have been carried out in terms of development of alternative energy sources.

Solar cells are classified into various types according to a material used to form a light absorbing layer, and silicon solar cells using silicon wafers have been the most widely used solar cells in recent years. However, price competitiveness of silicon solar cells has reached a limit, and thus, in order to further enhance price competitiveness, thin-film solar cells have drawn considerable attention. Since thin-film solar cells are manufactured with a small thickness, the consumption of materials and total weight may be reduced. Thus, thin film solar cells may be used in a wide variety of applications.

A thin-film solar cell including a chalcopyrite thin film as a light absorbing layer, the chalcopyrite thin film including elements of Groups IB, IIIA, and VIA known as CIS or CIGS, is one of the well-known types of thin-film solar cells. In general, a light absorbing layer having a $Cu(In,Ga)(S,Se)_2$ (CIGS) composition is one of the most important factors determining performance of solar cells.

A CIS or CIGS light absorbing layer is generally manufactured by coevaporating or sputtering metal elements. Particularly, a CIS or CIGS thin film may generally be deposited by coevaporating three elements using several operations. Alternatively, a CIS or CIGS thin film may be manufactured by sputtering metal targets such as Cu, In, and Ga and performing a selenization process. However, since these processes are performed under vacuum conditions, high-priced vacuum equipment is required. In addition, the use of such vacuum equipment may not only cause considerable losses of high-priced raw materials such as indium or gallium but may also make large-area production and a high processing speed more difficult to achieve.

Solution processes, as low-priced chemical methods that do not use vacuum equipment, have been used to replace vacuum deposition processes. Solution processes are cost effective and suitable for mass production. For example, a method of manufacturing a CIGS thin film by using a highly reactive hydrazine solution capable of directly dissolving a precursor metal compound has been known in the art. However, since the hydrazine solution is highly toxic and reactive, an additional device is required to maintain an inert atmosphere during manufacturing processes. Thus, there is a need for a non-toxic and easy-to-perform method to improve the benefits of solution processes.

Although much progress has been made in solar cell performance, there is a great difference in efficiency between vacuum processes and solution processes. Thus, there is a need for a solution process for manufacturing a CIGS thin film capable of improving solar cell performance.

SUMMARY

One or more embodiments include a method of manufacturing a CIGS thin film for a solar cell, the method capable of obtaining a solution-processed CIGS thin film suitable for interface engineering, in order to improve performance of the solar cell.

One or more embodiments include a method of manufacturing a junction structure of a buffer layer and a CIGS thin film for a solar cell by using the method of manufacturing a CIGS thin film.

One or more embodiments include a method of manufacturing a solar cell including the method of manufacturing a CIGS thin film.

One or more embodiments include a solar cell including the CIGS thin film manufactured according to the method of manufacturing a CIGS thin film.

Additional aspects will be set forth in part in the description which follows and, in part, will be apparent from the description, or may be learned by practice of the presented embodiments.

According to one or more embodiments, a method of manufacturing a CIGS thin film for a solar cell includes first heat-treating a CIG oxide thin film coated on a substrate by a solution process, the heat-treating being performed under an inert gas atmosphere, second heat-treating the CIG oxide thin film while supplying a gaseous phase selenium precursor to the CIG oxide thin film, thereby forming a $Cu_{2-x}Se$ ($0 \leq x < 1$) phase, and third heat-treating the thin film in which the $Cu_{2-x}Se$ phase is formed under an atmosphere including a gaseous phase sulfur precursor, thereby forming a CIGS thin film.

According to one or more embodiments, a method of manufacturing a junction structure of a buffer layer and a CIGS thin film for a solar cell includes manufacturing a CIGS thin film for a solar cell according to the method of manufacturing a CIGS thin film, and forming a buffer layer including cadmium zinc sulfide on the CIGS thin film.

According to one or more embodiments, a method of manufacturing a solar cell includes forming a CIGS thin film on a first electrode by using the method of manufacturing a CIGS thin film, and forming a second electrode on the CIGS thin film.

According to one or more embodiments, a solar cell includes a CIGS thin film manufactured according to the method of manufacturing a CIGS thin film.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
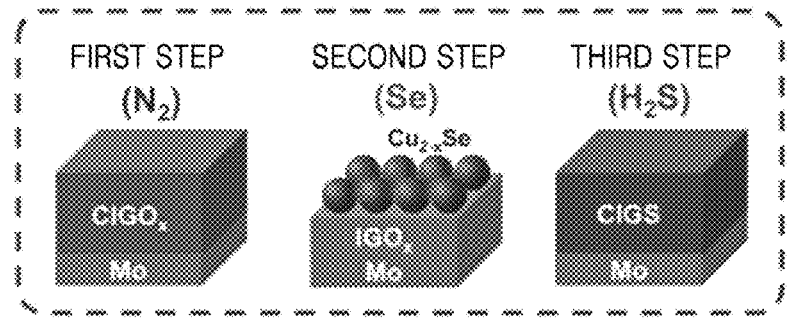
FIG. 1 is a schematic diagram for describing a method of manufacturing a CIGS thin film for solar cells, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, a method of manufacturing a CIGS thin film for solar cells, a method of manufacturing a junction structure of a buffer layer and a CIGS thin film for a solar cell and a method of manufacturing a solar cell using the method of manufacturing a CIGS thin film, and a solar cell including a CIGS thin film manufactured according to the method of manufacturing a CIGS thin film.

Although much progress has been made in performance of solar cells, insufficient growth of particles by solution processes is one of the many reasons for a big difference in efficiency between vacuum processes and solution processes. This is because boundaries of particles may act as recombination centers leading to losses of photovoltaic carriers. Thus, present inventors have applied a three-step chalcogenization process to a method of manufacturing a CIGS thin film having an ideal double band gap grade with a large particle size to improve performance of the CIGS thin film by a solution process.

A method of manufacturing a CIGS thin film for solar cells according to an embodiment includes a three-step chalcogenization process. The method of manufacturing a CIGS thin film for solar cells according to an embodiment includes first heat-treating a CIG oxide thin film coated on a substrate by a solution process under an inert gas atmosphere, second heat-treating the CIG oxide thin film while supplying a gaseous phase selenium precursor, thereby forming a $Cu_{2-x}Se$ (0≤x<1) phase, and third heat-treating the thin film in which the $Cu_{2-x}Se$ phase is formed under an atmosphere including a gaseous phase sulfur precursor, thereby forming a CIGS thin film.

According to the method of manufacturing a CIGS thin film for solar cells suitable for interface engineering may be obtained by growing particles derived from $Cu_{2-x}Se$ and forming a CIGS thin film having a double band gap grade structure via a three-step chalcogenization process as described above on the CIG oxide thin film coated on the substrate. Since the $Cu_{2-x}Se$ phase formed during the three-step chalcogenization process acts as a fluxing agent in a crystallization process, the growth of CIGS particles may be enhanced and performance of the CIGS thin film may be improved by a solution process.

The CIG oxide thin film coated on the substrate may be formed by a solution process. For example, the CIG oxide thin film may be obtained by coating a solution including Cu, In, and Ca precursors in an alcohol solvent on the substrate and heat-treating the coated solution under an air atmosphere. The coating may be performed by spin coating or doctor blading. For example, the CIG oxide thin film may be obtained by coating a paste including Cu, In, and Ga precursors on a substrate by spin coating or doctor blading and heat-treating the coated paste under an air atmosphere at a temperature of about 250° C. to about 350° C. for about 1 minute to about 60 minutes. By the heat treatment, carbon impurities are removed from the thin film and Cu, In, and Ga react with oxygen to form a noncrystalline CIG oxide thin film.

Although the CIG oxide includes Cu, In, and Ga as main components but may further include other doping components.

In this regard, the substrate may include at least one substrate coated with a conductive layer selected from, for example, molybdenum (Mo), fluorine tin oxide (FTO), and indium tin oxide (ITO).

The CIG oxide thin film coated on the substrate by the solution process as described above may be subjected to the three-step chalcogenization process to form a CIGS thin film.

Figure 2:
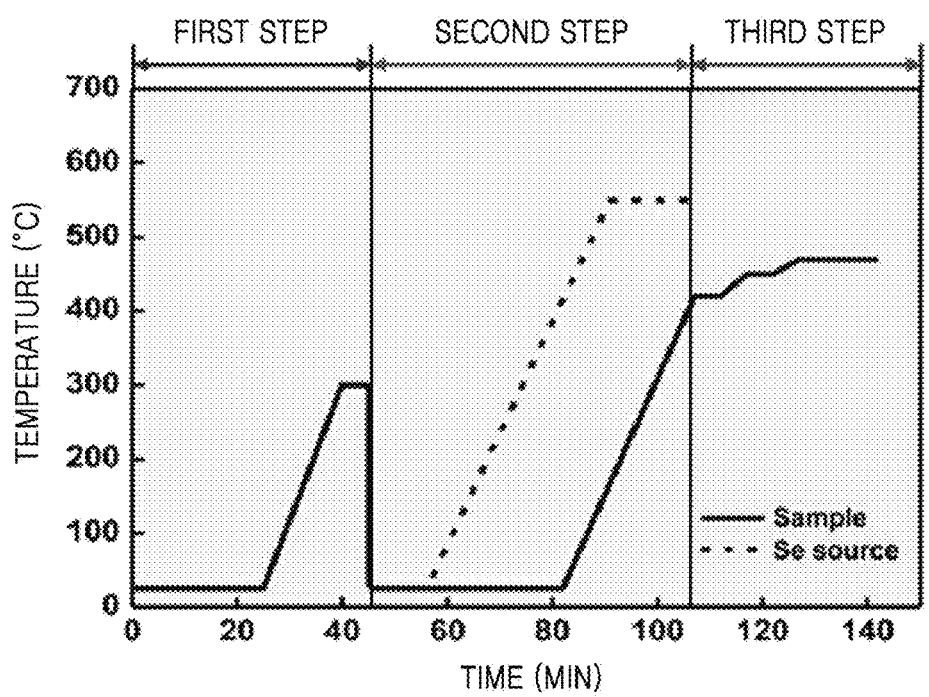
FIG. 2 is a graph exemplarily illustrating a temperature profile of respective operations of a chalcogenization process according to an embodiment.

FIG. 1 is a schematic diagram for describing a method of manufacturing a CIGS thin film for solar cells according to an embodiment. FIG. 2 is a graph exemplarily illustrating a temperature profile of respective operations of a chalcogenization process according to an embodiment.

As illustrated in FIG. 1, the CIG oxide thin film coated on the substrate may be subjected to the three-step chalcogenization process to obtain a CIGS thin film for solar cells. By the three-step chalcogenization process, the growth of CIGS particles may be promoted by forming the $Cu_{2-x}Se$ phase by using a 2-stage tube furnace in which a sample and a Se source (e.g., Se pellets) are separated from each other and a CIGS thin film having a desired double band gap grade structure may be manufactured.

In the first heat-treating of the chalcogenization process, the first heat-treating may be performed under an inert $N_2$ gas atmosphere. By the first heat-treating, an amount of oxygen atoms present in the substrate is reduced, and thus formation of an oxide layer by a substrate-derived component may be inhibited at a CIGS/substrate interface. For example, the first heat-treating of the CIG oxide thin film coated on the Mo substrate under an inert $N_2$ gas atmosphere may prevent formation of a $MoO_3$ layer. Since the $MoO_3$ layer inhibits formation of a $MoSe_2$ layer, formation of the $MoO_3$ layer is undesirable. The $MoSe_2$ layer is well known to improve adhesion at a CIGS/Mo interface.

The first heat-treating may be performed at a temperature of, for example, about 200° C. to about 400° C. for about 5 minutes to about 90 minutes. Within these ranges, the amount of oxygen atoms present in the substrate may be reduced.

The method may further include cooling the CIG oxide thin film before the second heat-treating after the first heat-treating.

In the second heat-treating step of the chalcogenization process, the CIG oxide thin film is heat-treated while a gaseous phase selenium (Se) precursor is supplied thereto to form a $Cu_{2-x}Se$ (0≤x<1) phase. The second heat-treating may also be performed under an inert $N_2$ gas atmosphere. For example, in the second heat-treating, Se vapor may be provided to the CIG oxide thin film by heating Se pellets under an inert $N_2$ gas atmosphere.

The $Cu_{2-x}Se$ phase may be formed by the second heat-treating. Since the $Cu_{2-x}Se$ phase acts as a fluxing agent during a crystallization process, the growth of CIGS particles may be promoted.

The second heat-treating may include raising a temperature to a higher temperature than that of the first heat-treating.

According to an embodiment, the CIG oxide thin film may be heat-treated at a temperature of about 200° C. to about 600° C. under an inert gas atmosphere while supplying the gaseous phase selenium precursor thereto. For example, the CIG oxide thin film may be heat-treated at a temperature of 300° C. or higher and lower than 450° C. under an inert gas atmosphere while supplying the gaseous phase selenium precursor thereto. The second heat-treating may be performed at a temperature of, for example, about 200° C. to about 600° C. for about 5 minutes to about 120 minutes. Within theses ranges, formation of the $Cu_{2-x}Se$ phase may be maximized.

The gaseous phase selenium precursor may be selenium vapor.

For example, the gaseous phase selenium precursor may be supplied by supplying selenium vapor by heating selenium pellets in the second heating-treating. By using the 2-stage tube furnace in which a sample and a Se source (Se pellets) are separated from each other, a CIGS thin film having a desired double band gap grade structure may be manufactured.

In the third heat-treating of the chalcogenization process, the thin film having the $Cu_{2-x}Se$ phase is heat-treated under an atmosphere including a gaseous phase sulfur precursor to form the CISG thin film. the gaseous phase sulfur precursor may be $H_2S$.

The third heat-treating may include raising a temperature to a higher temperature than that of the second heat-treating. For example, the third heat-treating may be performed by raising a temperature to a temperature 10° C. to 100° C. higher than that of the second heat-treating. Since the third heat-treating is performed at a higher temperature than that of the second heat-treating, a band gap may be designed as a double grading model by adjusting amounts of sulfur and selenium in the thin film in a non-vacuum solution process. This may alleviate difficulty in adjusting amounts of elements in a solution process in the related art to increase effects on realizing a high efficiency solar cell.

The third heat-treating may be performed by raising the temperature stepwise from the temperature of the second heat-treating. The temperature may be increased in several stages in an atmosphere in which a gaseous phase sulfur precursor flows to provide a sufficient time for growing particles derived from the $Cu_{2-x}Se$ phase.

For example, the third heat-treating may be performed at a temperature of about 400° C. to about 600° C. for about 5 minutes to about 120 minutes. Within these ranges, a CIGS thin film having an increased particle size may be obtained.

The CIGS thin film for solar cells manufactured as described above may have a large particle size and an ideal double band gap grade structure. For example, the particle size of the CIGS particles constituting the CIGS thin film may be in the range of about 600 nm to about 1000 nm. Since the CIGS particles having a particle size of about 300 nm to about 400 nm are obtained according to heat treatment of blowing selenium particles under a hydrogen sulfide atmosphere from the beginning of the heat treatment commonly used in the art, the particle size of the CIGS particles may be doubled by using the method according to the present embodiment.

A solar cell according to another embodiment includes the CIGS thin film for solar cells manufactured as described above.

According to an embodiment, the solar cell may further include a buffer layer including cadmium zinc sulfide on the CIGS thin film. By a p-n junction between the CIGS thin film for solar cells and the buffer layer including cadmium zinc sulfide and formed on the thin film, interface recombination may be prevented.

Since the surface of the CIGS thin film is rich in S, a ternary cadmium zinc sulfide (Cd,Zn)S buffer layer may be formed to create a desirable "spike" conduction band alignment instead of a "cliff" alignment, thereby inhibiting interface recombination.

In the p-n junction structure between the CIGS thin film and the (Cd,Zn)S buffer layer, inhibition of interface recombination is explained by comparing recombination activation energies of the buffer layer and the CIGS thin film.

Figure 7:
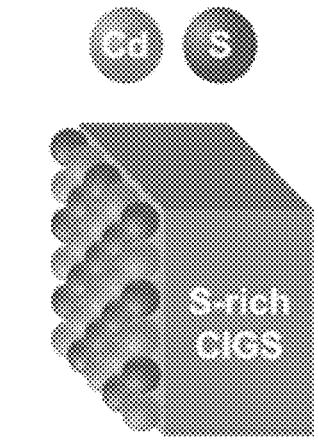
FIG. 7 shows schematic band diagrams of a CdS/CIGS p-n structure and a (Cd,Zn)S/CIGS p-n junction structure.
Figure 7:
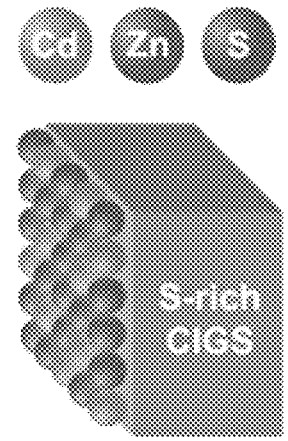
Figure 7:
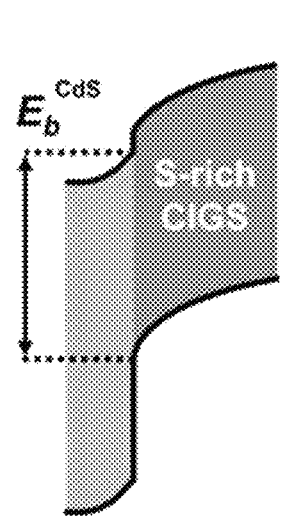
Figure 7:
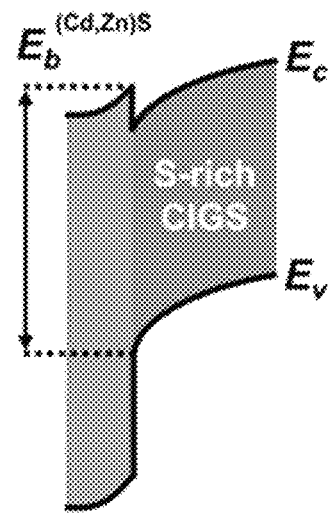

FIG. 7 shows schematic band diagrams of a CdS/CIGS p-n junction structure and a (Cd,Zn)S/CIGS p-n junction structure. In this regard, interface recombination barriers are also shown. This will be described with reference to FIG. 7.

A band alignment structure of a p-n junction is one of the important factors determining performance of a CIGS thin film solar cell. This is because the band alignment structure is closely related to the interface recombination barrier $E_b$ that is an energy difference between a lowest point of a conduction band (CBM) of an n-type buffer layer and a highest point of a valence band (VBM) of a p-type CIGS absorbing layer at the p-n junction interface. In addition, it has been widely reported that a serious interface recombination is caused in a "cliff" type conduction band alignment since the "cliff" type conduction band alignment in which a CBM of a CIGS absorber is higher than a CMB of a butter layer has a relatively low $E_b$. On the contrary, interface recommunication may be inhibited in a "spike" type conduction band alignment in which a CBM of a CIGS absorber is lower than a CBM of a buffer layer at a p-n junction interface since the "spike" type conduction band alignment has a relatively high $E_b$ value. Unless a height of a "spike" structure exceeds 0.4 eV, disturbance of electron movement toward the buffer layer is negligible.

In the case of a CIGS absorber having a wide band gap favorable for higher photovoltage, it is difficult for a CBM of a CIGS absorber to form a "spike" conduction band alignment at a p-n junction interface. Thus, a CIGS absorber which is rich in Ga and/or S has poor solar cell performance.

On the contrary, since the surface of the CIGS thin film for solar cells is rich in S, an excellent "spike" conduction band alignment may be formed at a p-n junction interface via the p-n junction with the (Cd,Zn)S buffer layer instead of the CdS buffer layer. A relatively large recombination activation energy may be identified in the (Cd,Zn)S buffer layer. This indicates that interface recombination is considerably inhibited via optimization of bandgap alignment.

A method of manufacturing a junction structure of a buffer layer and a CIGS thin film for a solar cell according to another embodiment includes manufacturing the CIGS thin film by the above-described method of manufacturing a CIGS thin film, and forming a buffer layer including cadmium zinc sulfide on the CIGS thin film.

A method of manufacturing a solar cell according to another embodiment includes forming a CIGS thin film on a first electrode layer, and forming a second electrode layer on the CIGS thin film.

Since the method of manufacturing the CIGS thin film is described in detail above, descriptions thereof will not be repeated.

According to an embodiment, the first electrode may include at least one selected from molybdenum, fluorine tin oxide, and indium tin oxide. However, any other conductive and transparent material may also be used without limitation.

The second electrode is formed on the CIGS thin film and may include at least one selected from molybdenum, fluorine tin oxide, indium tin oxide, nickel, and aluminum.

The solar cell may further include a buffer layer including cadmium sulfide or cadmium zinc sulfide. The solar cell may further include at least one metal oxide selected from titanium oxide, zinc oxide, and tin oxide.

The CIGS thin film solar cell obtained as described above may exhibit remarkably improved power conversion efficiency (PCE) as compared with CIGS thin film solar cells efficiently solution-treated except for a toxic and reactive hydrazine solution.

One or more embodiments will be described in more detail, according to the following examples and comparative examples. However, the following examples are merely presented to exemplify the present invention, and the scope of the present invention is not limited thereto.

Example 1: Preparation of CIGS Thin Film

Copper nitrate hydrate ($Cu(NO_3)_2 \cdot xH_2O$, 99.999%, Sigma-Aldrich, 0.94 g), indium nitrate hydrate ($In(NO_3)_3 \cdot xH_2O$, 99.99%, Sigma-Aldrich, 1.15 g), and gallium nitrate hydrate ($Ga(NO_3)_3 \cdot xH_2O$, 99.999%, Alfa Aesar, 0.49 g) were dissolved in a methanol solvent (8 mL) to prepare a metal precursor solution. Meanwhile, polyvinyl acetate (average molecular weight: 100,000 g/mol, Sigma-Aldrich, 1.0 g) was dissolved in a vinyl acetate solvent (8 mL) and the solution was vigorously stirred to prepare a binder solution. The two solutions were mixed at 25° C. for 30 minutes and filtered to obtain a CIG solution.

The CIG solution was spin-coated on a molybdenum (Mo) layer, which was sputtered on a soda-lime glass (SLG) to a thickness of 500 nm, at 2000 rpm for 40 seconds and air-annealed in a box furnace at 300° C. for 30 minutes. This deposition process was repeated six times to prepare a CIG oxide thin film having a thickness of 1 μm.

The CIG oxide thin film was subjected to a three-step chalcogenization process to be described below by using a 2-stage tube furnace in which a sample and Se pellets (99.99%, Sigma-Aldrich, 0.5 g) are separated from each other to prepare a CIGS thin film. In the first heat-treating, the prepared CIG oxide thin film was annealed at 300° C. for 5 minutes under an inert $N_2$ gas atmosphere without heating Se pellets. In the second heat-treating, the sample was heat-treated at 25° C. for 35 minutes and heated to 400° C. under an inert $N_2$ gas atmosphere. Meanwhile, the Se pellets were heat-treated at 550° C. for 15 minutes to supply Se vapor to the CIG oxide thin film. In the third heat-treating, a flowing gas was changed to $H_2S$ ($H_2S(1\%)/N_2$) and the sample was heated to 475° C. stepwise and strongly sulfurated for 15 minutes to obtain a CIGS thin film.

Example 2: Preparation of CIGS Thin Film Solar Cell

A CIGS thin film solar cell was manufactured by forming a CdS buffer layer having a thickness of about 50 nm on the CIGS thin film by a chemical wet process using cadmium sulfate ($CdSO_4$, ≥99.99%, Sigma-Aldrich, 0.16 g), depositing an i-ZnO (50 nm)/Al:ZnO (500 nm) window layer by RF sputtering, and depositing an Ni/Al upper electrode by using an electron beam.

Example 3: Preparation of CIGS Thin Film Solar Cell

A CIGS thin film solar cell was manufactured in the same manner as in Example 2, except that a (Cd,Zn)S buffer layer having a thickness of about 50 nm was formed instead of the CdS buffer layer by replacing the $CdSO_4$ precursor (0.08 g) with zinc sulfate heptahydrate ($Zn(SO_4) \cdot 7H_2O$, 99.999%, Sigma-Aldrich, 0.11 g).

Comparative Example 1

Copper nitrate hydrate ($Cu(NO_3)_2 \cdot xH_2O$, 99.999%, Sigma-Aldrich, 0.82 g), indium nitrate hydrate ($In(NO_3)_3 \cdot xH_2O$, 99.99%, Sigma-Aldrich, 1.12 g), and gallium nitrate hydrate ($Ga(NO_3)_3 \cdot xH_2O$, 99.999%, Alfa Aesar, 0.41 g) were dissolved in a methanol solvent (8.5 mL) to prepare a metal precursor solution. Meanwhile, polyvinyl acetate (average molecular weight: 100,000 g/mol, Sigma-Aldrich, 1.0 g) was dissolved in a vinyl acetate solvent (8.5 mL) and the solution was vigorously stirred to prepare a binder solution. The two solutions were mixed at 25° C. for 30 minutes and filtered to obtain a CIG solution.

The CIG solution was spin-coated on a Mo layer, which was sputtered on a SLG to a thickness of 500 nm, at 2000 rpm for 40 seconds and air-annealed in a box furnace at 300°

C. for 30 minutes. This deposition process was repeated six times to prepare a CIG oxide thin film having a thickness of 1 μm.

The CIG oxide thin film was subjected to a three-step chalcogenization process to be described below by using a 2-stage tube furnace in which a sample and Se pellets (99.99%, Sigma-Aldrich, 0.5 g) are separated from each other to prepare a CIGS thin film. First, the CIG oxide thin film and Se pellets were located on respective stages of the 2-stage tube furnace, and the Se pellets were maintained at 550° C. for 50 minutes under a $H_2S$ ($H_2S(1\%)/N_2$) gas atmosphere to supply gaseous phase Se to the CIGS oxide thin film. In the beginning of the supplying of the gaseous phase Se to the CIG oxide thin film, the temperature of the thin film was increased to 500° C. for 25 minutes and maintained for 15 minutes to simultaneously supply S and Se to the CIG oxide thin film for reactions.

A CIGS thin film solar cell was manufactured by using the manufactured CIGS thin film in the same process as in Example 2.

Evaluation Example 1: XRD Analysis

Figure 3:
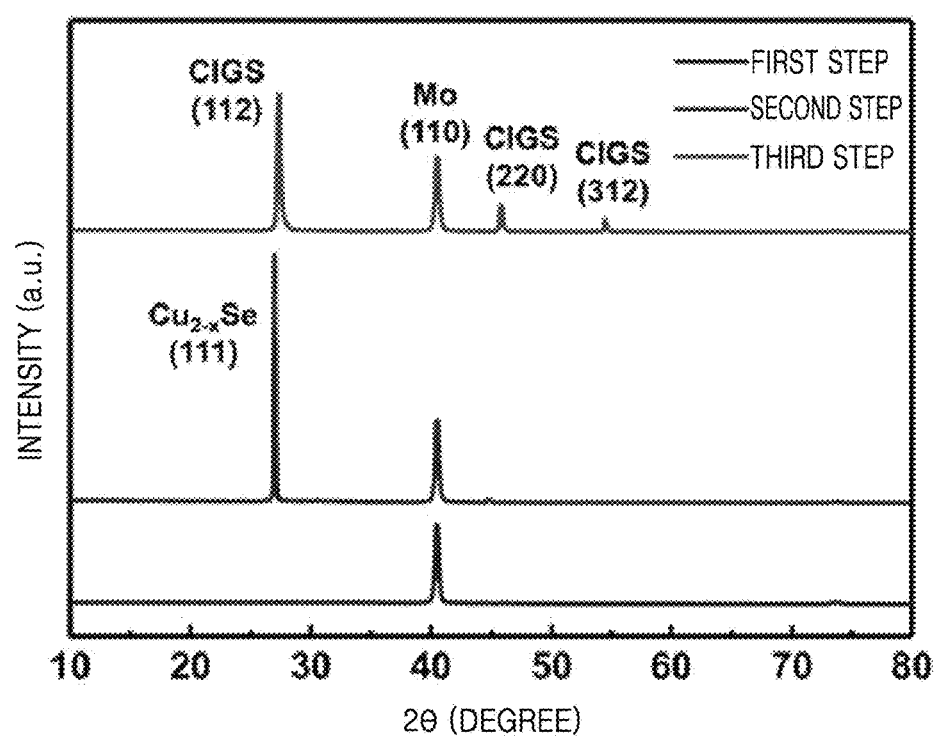
FIG. 3 is a graph illustrating X-ray diffraction (XRD) patterns of a CIGS thin film manufactured according to Example 1, in respective operations of a three-step chalcogenization process.

Phase transformation of the CIGS thin film manufactured according to Example 1 was identified by X-ray diffraction (XRD) analysis during the three-step chalcogenization process. FIG. 3 illustrates XRD patterns of the CIGS thin film in respective operations of the chalcogenization process.

As shown in FIG. 3, only an Mo peak (110) was observed at 40.5° (JCPDS 42-1120) after the first heat-treating indicating that there was no significant crystalline phases of Cu, In, Ga, and O. On the other hand, a strong $Cu_{2+x}Se$ peak (111) was observed at 26.98° (JCPDS 06-0680) as a result of optimized heat treatment in the second heat-treating indicating that Cu, which is the most reactive among Cu, In and Ga, selectively reacted with the Se vapor. Finally, chalcopyrite CIGS peaks were observed at 27.32°, 45.82° and 54.53° (JCPDS 35-1101) respectively corresponding to (112), (220), and (312) planes.

Evaluation Example 2: SEM Analysis

Figure 4:
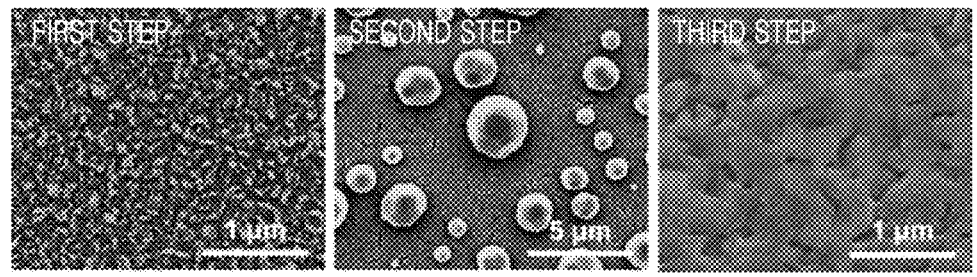
FIG. 4 shows scanning electron microscope (SEM) images of surfaces of the CIGS thin film manufactured according to Example 1, in respective operations of the three-step chalcogenization process.

Scanning electron microscope (SEM) images of surfaces of the CIGS thin film manufactured according to Example 1 were obtained in respective operations of the three-step chalcogenization process and the results are shown in FIG. 4.

As shown in FIG. 4, a $CIGO_x$ thin film has a porous surface with nanoparticles after the first heat-treating. Since Cu atoms may easily diffuse to the surface of the thin film in this for, the $Cu_{2-x}Se$ phase may efficiently be formed.

After the second heat-treating, numerous micron-sized $Cu_{2-x}Se$ particles were identified on the surface of an $(In,Ga)O_x$ thin film indicating selective reactions between Cu atoms and Se vapor. According to previous reports, formation of a binary phase of $Cu_{2-x}Se$ and InSe is started at 270° C. and a ternary $CuInSe_2$ is formed at 340° C. However, although a maximum temperature of the second heat-treating of the chalcogenization process was 400° C. in Example 1, no phase other than the $Cu_{2-x}Se$ phase was formed. It is considered that this phenomenon is caused by an amorphous oxide structure of the thin film which may interfere with reactions between In or Ga and Se.

After the third heat-treating, $Cu_{2-x}Se$ particles completely disappeared and a CIGS thin film was obtained by heat treatment under a $H_2S$ gas atmosphere. The surface of the CIGS thin film was highly dense without having large cracks or pinholes.

Figure 5:
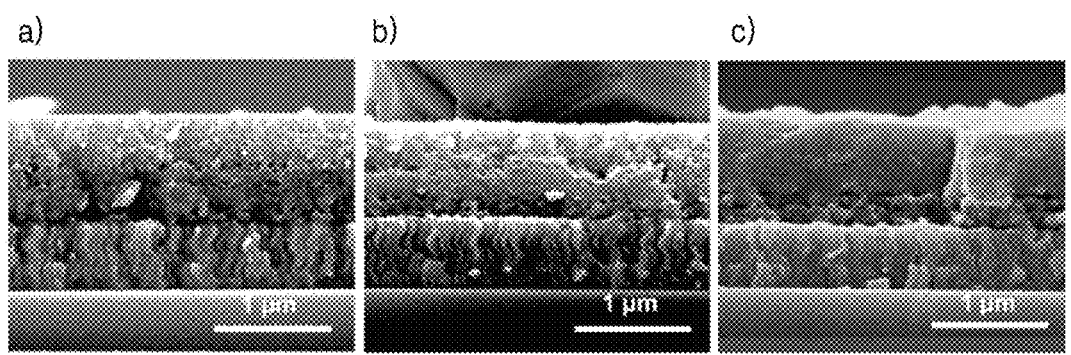
FIG. 5 shows SEM cross-sectional images of the CIGS thin film manufactured according to Example 1, in respective operations of the three-step chalcogenization process.

SEM cross-sectional images of the CIGS thin film manufactured according to Example 1 in respective operations of the three-step chalcogenization process are shown in FIG. 5. As shown in FIG. 5, a cross-section of the thin film after the third heat-treating shows a large particle size of 700 nm and particles well connected in the transverse direction. This result indicates that $Cu_{2-x}Se$ successfully promotes the growth of CIGS particles during the third heat-treating.

Evaluation Example 3: D-SIMS Depth Profile Analysis

Figure 6:
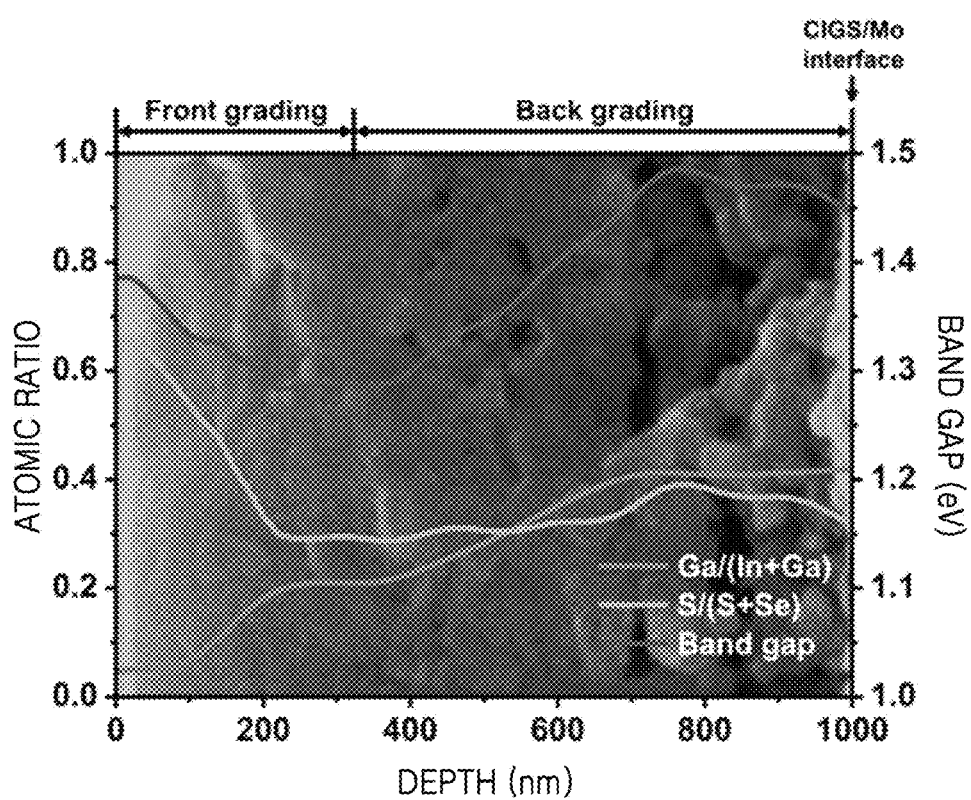
FIG. 6 is a graph illustrating an atomic depth profile of the CIGS thin film manufactured according to Example 1, analyzed by using a dynamic secondary ion mass spectrometer (D-SIMS)

An atomic depth profile was analyzed by using a dynamic secondary ion mass spectrometer (D-SIMS) to investigate a band gap grade structure of the CIGS thin film manufactured according to Example 1 and the results are shown in FIG. 6. FIG. 6 illustrates atomic ratios of Ga/(In+Ga) and S/(S+Se) and a band gap profile.

As shown in FIG. 6, an atomic ratio of Ga/(In+Ga) continuously increases from 0.05 at a surface of the thin film to 0.42 at an CIGS/Mo interface. However, distribution of S/(S+Se) is divided into two regions. Although a profile of S/(S+Se) is uniform in a bulk CIGS region (300 nm to 1000 nm), an atomic ratio thereof rapidly increases on a surface and in a space charge region (SCR, 0 nm to 300 nm) to a maximum value of 0.65. Thus, the bulk region of CIGS is estimated as back band gap graded mainly due to a monotone increase of Ga/(In+Ga). In addition, a strong bond of S on the surface and in the SCR has resulted in front band gap graded. As a result, it may be confirmed that the double band gap grade structure is successfully implemented by the three-step chalcogenization process.

Evaluation Example 4: Evaluation of Performance of CIGS Absorbing Layer

The CIGS thin film of Example 1 was compared with a CIGS thin film of the related art manufactured by the process of Comparative Example 1 (simultaneously supplying selenium vapor and $H_2S$ gas) to identify a quality of the CIGS thin film of Example 1 manufactured according to the three-step chalcogenization process. Unit cells of CIGS thin film solar cells were manufactured by using each of the CIGS thin film and a CdS buffer layer and photocurrent-voltage curves thereof were compared. The analysis was performed using a Sun2000 solar simulator available from ABET Technologies (USA) under conditions of 1 SUN (100 mW/cm$^2$).

Figure 8:
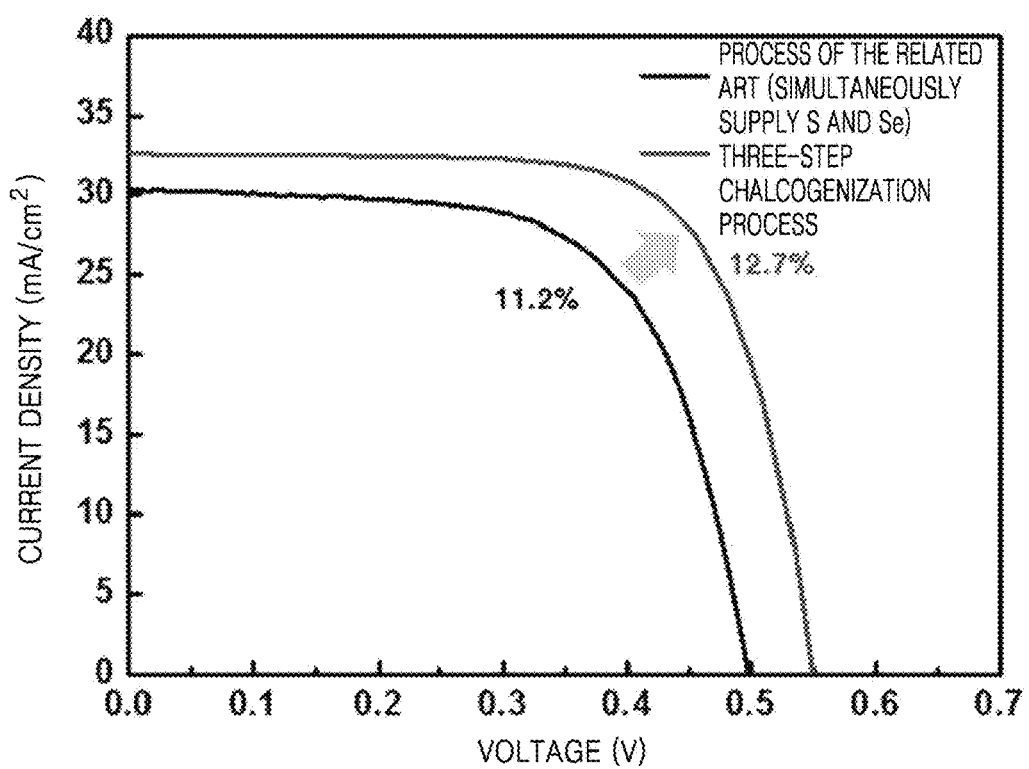
FIG. 8 is a graph illustrating photocurrent-voltage curves of unit cells of solar cells manufactured using CIGS thin films prepared according to Example 1 and Comparative Example 1, for confirming the quality of the CIGS thin film manufactured according to Example 1.

Photocurrent-voltage curve comparison results are shown in FIG. 8. As shown in FIG. 8, the solar cell manufactured using the CIGS absorbing layer according to Example 1 by the three-step chalcogenization process exhibits improved solar cell parameters such as open voltage, short-circuit current, and filling rate when compared with the solar cell according to Comparative Example 1. Particularly, the solar cell of Example 1 had an open voltage about 50 mV higher and a short-circuit current about 2.5 mA/cm$^2$ higher than those of Comparative Example 1, indicating that the growth of CIGS particles by $Cu_{2-x}Se$ reduced recombination losses. As a result, according to the three-step chalcogenization process, an efficiency of 12.7%, which is about 1.5% higher than that of the solar cell of the related art, may be obtained.

Evaluation Example 5: Evaluation of Performance of Solar Cell According to Buffer Layer Current-voltage curves of the CIGS thin film solar cells manufactured according to Examples 2 and 3 were analyzed by a Sun2000 solar simulator available from ABET Technologies (USA) was used for AM 1.5.

Figure 9:
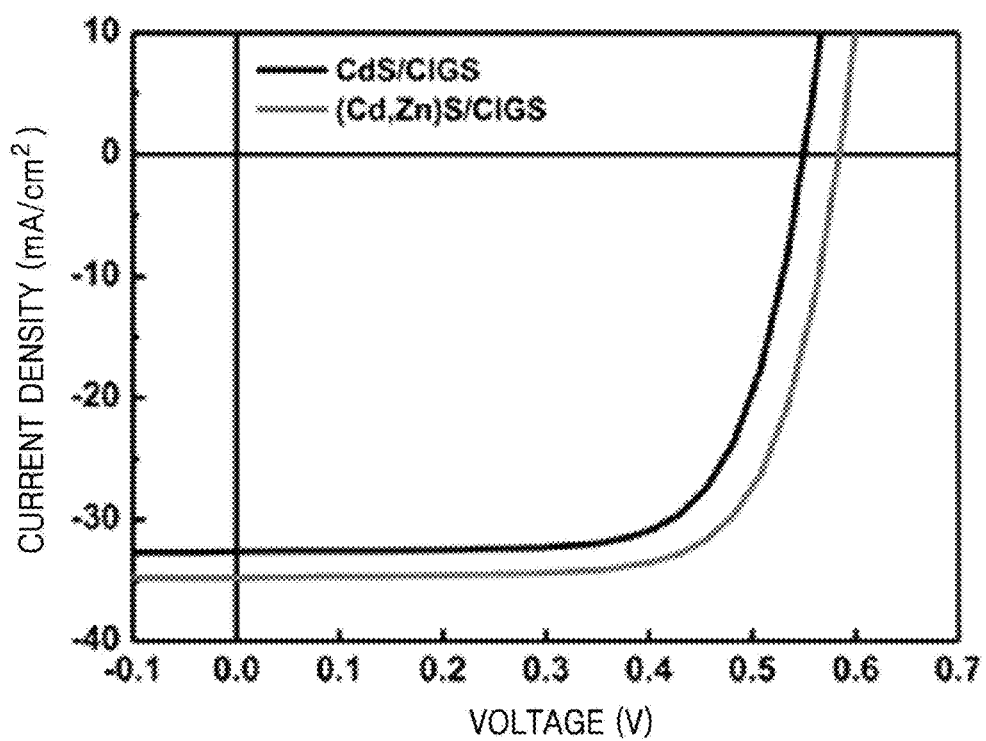
FIG. 9 is a graph illustrating photocurrent-voltage curves of CIGS thin film solar cells manufactured according to Examples 2 and 3.

The photocurrent-voltage curves of the CIGS thin film solar cells are shown in FIG. 9. Voltage ($V_{oc}$), current density ($J_{sc}$), filling factor (FF), and conversion efficiency (Eff, $\eta$) calculated from the photocurrent-voltage curves are shown in Table 1 below. In Table 1, $J_{sc}$, $V_{oc}$, and FF and n are obtained from photo J-V curves. Series resistance ($R_s$), shunt resistance ($R_{sh}$), ideality factor (A), and $J_0$ were calculated by using dark J-V curve data.

TABLE 1

| | $J_{sc}$ [mA·cm$^{-2}$] | $V_{oc}$ [V] | FF [%] | $R_s$ [Ω·cm$^2$] | $R_{sh}$ [Ω·cm$^2$] | A | $J_0$ [mA·cm$^{-2}$] | $\eta$ [%] |
|---|---|---|---|---|---|---|---|---|
| Example 2 CdS/CIGS | 32.61 | 0.549 | 70.91 | 1.10 | 3.57 × 10$^5$ | 1.64 | 3.59 × 10$^{-5}$ | 12.7 |
| Example 3 (Cd,Zn)S/CIGS | 34.73 | 0.584 | 71.00 | 0.79 | 1.32 × 10$^5$ | 1.58 | 1.38 × 10$^{-6}$ | 14.4 |

As shown in FIG. 9 and Table 1, the CIGS thin film solar cell of Example 2 had a short circuit current density ($J_{sc}$) of 32.61 mA·cm$^{-2}$, an open circuit voltage ($V_{oc}$) of 0.549 V, a fill factor (FF) of 70.91%, and a PCE($\eta$) of 12.7% indicating acceptable performance.

The CIGS thin film solar cell of Example 3 had a short circuit current density ($J_{sc}$) of 34.73 mA·cm$^{-2}$, an open circuit voltage ($V_{oc}$) of 0.584 V, a fill factor (FF) of 71.00%, and a PCE($\eta$) of 14.4% indicating better performance than the CdS/CIGS sample of Example 2. The PCE of 14.4% of the (Cd,Zn)S/CIGS sample according to Example 3 is similar to that of the CIGS thin film solar cell manufactured by a solution process, which is the most efficient except for the highly toxic and reactive hydrazine solution.

Figure 10:
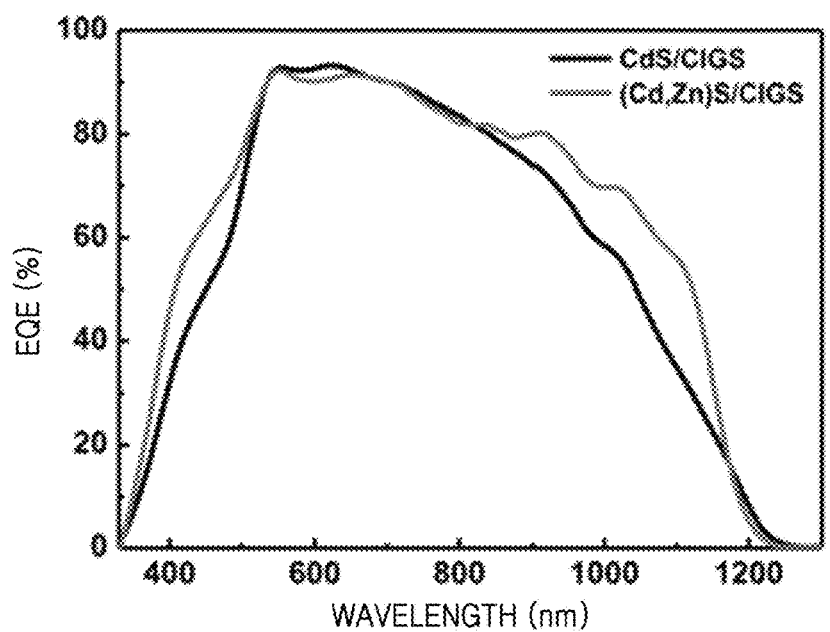
FIG. 10 is a graph illustrating external quantum efficiencies (EQE) of the CIGS thin film solar cells manufactured according to Examples 2 and 3, wherein the EQE was analyzed by photon-to-current conversion efficiency.

For better understanding of enhancement of $J_{sc}$ in the(Cd, Zn)S/CIGS sample, external quantum efficiencies (EQE) of the CIGS thin film solar cells manufactured according to Examples 2 and 3 were analyzed by photon to current conversion efficiency, and the results are shown in FIG. 10.

As shown in FIG. 10, an EQE of the (Cd,Zn)S/CIGS sample is higher than that of the CdS/CIGS sample in a wavelength range of 300 nm to 550 nm, leading to an additional $J_{sc}$ gain of 0.79 mA·cm$^{-2}$. This may be explained in terms of the fact that the (Cd,Zn)S buffer layer derived by addition of Zn had a transmittance 16.57% higher and a band gap 0.47 eV larger than those of the CdS/CIGS buffer layer. In addition, a considerable increase in EQE was observed in a wavelength range of 820 nm to 1170 nm together with a $J_{sc}$ gain of 1.60 mA·cm$^{-2}$, indicating that inhibition of interface recombination improves collection of minority carriers generated in a deeper portion of the CIGS absorber.

In order to identify inhibition of interface recombination in a (Cd,Zn)S/CIGS junction, temperature-dependent current density voltage (J-V-T) analysis was performed on the CdS/CIGS sample of Example 2 and the (Cd,Zn)S/CIGS of Example 3 at a temperature of 160 K to 300 K in a dark condition with no light. Aln($J_0$) vs 1/kT plots of the two samples obtained from dark J-V-T data are shown in FIG. 11.

Figure 11:
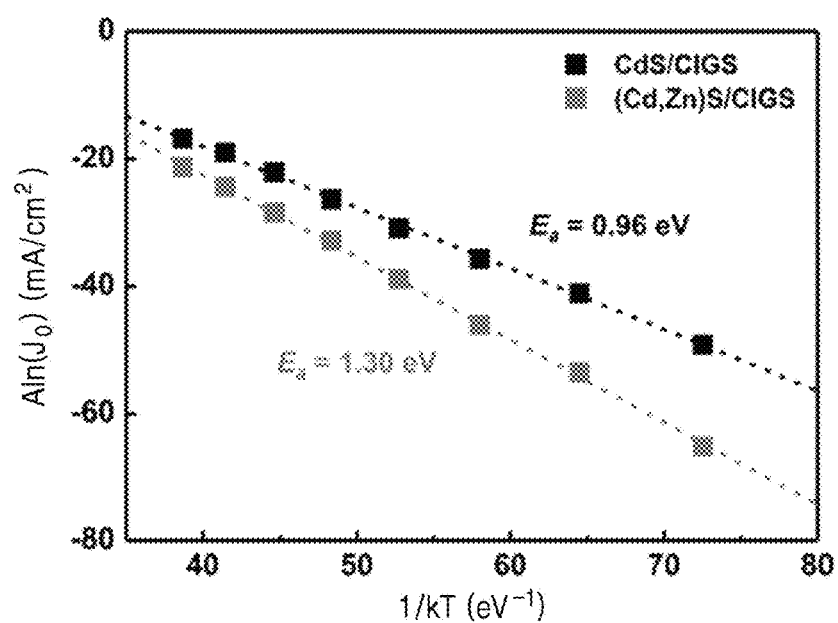
FIG. 11 is a graph illustrating $Aln(J_0)$ vs $1/kT$ plots of a CdS/CIGS sample of Example 2 and a (Cd,Zn)S/CIGS sample of Example 3 obtained by temperature-dependent current density voltage (J-V-T) analysis performed in dark conditions with no light.

As shown in FIG. 11, the CdS/CIGS sample had an Ea value of 0.96 eV which is far lower than a band gap of the CIGS absorber, indicating that a dominant recombination path is formed in the CdS/CIGS p-n junction interface. Meanwhile, the (Cd,Zn)S/CIGS sample had an Ea value of 1.30 eV which is similar to the band gap of the CIGS absorber, indicating that bulk recombination of the CIGS absorber is more dominant than the recombination in the (Cd,Zn)S/CIGS interface. Since the dominant recombination path migrates from the p-n junction interface to the bulk region of the CIGS absorber, it may be confirmed that interface recombination is significantly reduced by using the (Cd,Zn)S buffer layer.

According to the method of manufacturing a CIGS thin film for solar cells according to an embodiment, a CIGS thin film having an ideal double band gap grade structure with a large particle size may be obtained by performing heat treatment on the solution-treated CIG oxide thin film by the three-step chalcogenization process. Accordingly, performance of the solar cell may be improved.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A method of manufacturing a CIGS thin film for a solar cell, the method comprising:
    first heat-treating a CIG oxide thin film coated on a substrate by a solution process, the heat-treating being performed under an inert gas atmosphere;
    second heat-treating the CIG oxide thin film while supplying a gaseous phase selenium precursor to the CIG oxide thin film, thereby forming a $Cu_{2-x}Se$ (0≤x<1) phase; and
    third heat-treating the thin film in which the $Cu_{2-x}Se$ phase is formed under an atmosphere comprising a gaseous phase sulfur precursor, thereby forming a CIGS thin film.

2. The method of claim 1, wherein the first heat-treating is performed at a temperature of about 200° C. to about 400° C. for about 5 minutes to about 90 minutes.

3. The method of claim 1, wherein the second heat-treating comprises raising a temperature to a higher temperature than that of the first heat-treating.

4. The method of claim 1, wherein the second-treating is performed by heat-treating the CIG oxide thin film at a temperature of about 200° C. to about 600° C. for about 5 minutes to about 120 minutes under an inert gas atmosphere while supplying the gaseous phase selenium precursor to the CIG oxide thin film.

5. The method of claim 1, wherein the gaseous phase selenium precursor is selenium vapor.

6. The method of claim 1, wherein the third heat-treating comprises raising a temperature to a higher temperature than that of the second heat-treating.

7. The method of claim 1, wherein the third heat-treating is performed by increasing the temperature stepwise from the temperature of the second heat-treating.

8. The method of claim 1, wherein the third heat-treating is performed at a temperature about 10° C. to about 100° C. higher than that of the second heat-treating.

9. The method of claim 1, wherein the gaseous phase sulfur precursor is $H_2S$.

10. The method of claim 1, wherein the CIG oxide thin film is obtained by coating a solution comprising Cu, In, and Ga precursors in an alcohol solvent on the substrate and heat-treating the coated solution under an air atmosphere.

11. The method of claim 10, wherein the coating is performed by at least one solution process selected from spin coating, doctor blading, and screen printing.

12. The method of claim 1, wherein the substrate comprises at least one selected from molybdenum, fluorine tin oxide, and indium tin oxide.

13. The method of claim 1, wherein the CIGS thin film has a double band gap grade structure.

14. A method of manufacturing a junction structure of a buffer layer and a CIGS thin film for a solar cell, the method comprising:
    manufacturing a CIGS thin film for a solar cell according to the method of claim 1; and
    forming a buffer layer comprising cadmium zinc sulfide on the CIGS thin film.

15. A method of manufacturing a solar cell, the method comprising:
    forming a CIGS thin film on a first electrode by using the method of claim 1; and
    forming a second electrode on the CIGS thin film.

16. The method of claim 15, wherein the first electrode comprises at least one selected from molybdenum, fluorine tin oxide, and indium tin oxide.

17. The method of claim 15, wherein the second electrode comprises at least one selected from molybdenum, fluorine tin oxide, indium tin oxide, nickel, and aluminum.

18. The method of claim 15, wherein the solar cell further comprises a buffer layer comprising cadmium zinc sulfide.

\* \* \* \* \*